(12) United States Patent
Campbell

(10) Patent No.: US 8,098,078 B1
(45) Date of Patent: *Jan. 17, 2012

(54) PROBING BLADE WITH CONDUCTIVE CONNECTOR FOR USE WITH AN ELECTRICAL TEST PROBE

(75) Inventor: Julie A. Campbell, Beaverton, OR (US)

(73) Assignee: LeCroy Corporation, Chestnut Ridge, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/715,269

(22) Filed: Mar. 1, 2010

Related U.S. Application Data

(63) Continuation of application No. 11/650,368, filed on Jan. 5, 2007, now Pat. No. 7,671,613.

(60) Provisional application No. 60/757,077, filed on Jan. 6, 2006.

(51) Int. Cl.
*G01R 31/20* (2006.01)

(52) U.S. Cl. .................................. 324/754.11

(58) Field of Classification Search .......................... None
See application file for complete search history.

(56) References Cited

U.S. PATENT DOCUMENTS

| | | | |
|---|---|---|---|
| 3,072,877 A | 1/1963 | Landwher | |
| 3,676,776 A | 7/1972 | Bauer et al. | |
| 3,885,848 A | 5/1975 | Brouneus | |
| 4,491,788 A * | 1/1985 | Zandonatti | 324/72.5 |
| 4,552,464 A * | 11/1985 | Rogers | 368/10 |
| 4,740,746 A | 4/1988 | Pollock et al. | |
| 4,773,877 A | 9/1988 | Kruger et al. | |
| 4,923,407 A | 5/1990 | Rice et al. | |
| 4,978,312 A | 12/1990 | Fodali | |
| 5,032,787 A | 7/1991 | Johnston et al. | |
| 5,151,040 A | 9/1992 | Tanaka | |
| 5,914,612 A * | 6/1999 | Koken et al. | 324/750.26 |
| 5,967,856 A | 10/1999 | Meller | |
| 5,982,187 A | 11/1999 | Tarzwell | |
| 5,997,360 A | 12/1999 | Gen-Kuong et al. | |
| 6,083,059 A | 7/2000 | Kuan | |
| 6,137,302 A | 10/2000 | Schwindt | |
| 6,191,594 B1 | 2/2001 | Nightingale et al. | |
| D444,401 S | 7/2001 | Campbell | |
| D444,720 S | 7/2001 | Campbell | |
| 6,271,673 B1 | 8/2001 | Furuta et al. | |
| 6,292,701 B1 | 9/2001 | Prass et al. | |
| 6,363,605 B1 | 4/2002 | Shih et al. | |
| 6,400,167 B1 | 6/2002 | Gessford et al. | |
| 6,404,215 B1 | 6/2002 | Nightingale et al. | |
| 6,447,343 B1 | 9/2002 | Zhang et al. | |
| 6,464,511 B1 | 10/2002 | Watanabe et al. | |
| 6,518,780 B1 | 2/2003 | Campbell et al. | |
| 6,538,424 B1 | 3/2003 | Campbell | |
| 6,603,297 B1 | 8/2003 | Gessford et al. | |

(Continued)

FOREIGN PATENT DOCUMENTS

JP 01-2700391 10/1989

(Continued)

*Primary Examiner* — Paresh Patel
(74) *Attorney, Agent, or Firm* — Law Office of Karen Dana Oster, LLC

(57) ABSTRACT

A conductive connector includes a flexible-deflectable extension having a probing end and a head connection end. A conductive transmission path extends between the probing end and the head connection end. A pogo-rotational-action pin is electrically connected to the transmission path at the head connection end of the flexible-deflectable extension.

21 Claims, 6 Drawing Sheets

U.S. PATENT DOCUMENTS

| | | |
|---|---|---|
| 6,650,131 B2 | 11/2003 | Campbell et al. |
| 6,791,345 B2 | 9/2004 | Maruyama et al. |
| 6,809,535 B2 | 10/2004 | Campbell |
| 6,828,768 B2 | 12/2004 | McTigue |
| 6,863,576 B2 | 3/2005 | Campbell et al. |
| 7,091,730 B1 | 8/2006 | Parshotam et al. |
| 7,138,810 B2 | 11/2006 | Lesher et al. |
| 7,140,105 B2 | 11/2006 | Campbell |
| 7,242,173 B2 | 7/2007 | Cavoretto |
| 7,262,614 B1 | 8/2007 | Campbell |
| 2002/0052155 A1 | 5/2002 | Campbell et al. |
| 2003/0189438 A1 | 10/2003 | Campbell et al. |
| 2003/0193341 A1 | 10/2003 | McTigue |
| 2004/0207417 A1 | 10/2004 | Barr |

FOREIGN PATENT DOCUMENTS

| | | |
|---|---|---|
| JP | 04-086009 | 3/1992 |

* cited by examiner

PROBING BLADE WITH CONDUCTIVE CONNECTOR FOR USE WITH AN ELECTRICAL TEST PROBE

The present application is a continuation of U.S. patent application Ser. No. 11/650,368, filed Jan. 5, 2007, now U.S. Pat. No. 7,671,613. U.S. patent application Ser. No. 11/650,368 is an application claiming the benefit under 35 USC Section 119(e) of U.S. Provisional Patent Application Ser. No. 60/757,077, filed Jan. 6, 2006. The present application is based on and claims priority from these applications, the disclosures of which are hereby expressly incorporated herein by reference.

BACKGROUND OF INVENTION

The present invention relates to an electrical test probe tip ("probing tip"), and more particularly to a probing blade.

A probing system generally includes an electrical test probe for providing an electrical connection between signal testing points of electrical components (e.g. integrated circuits) and testing instruments (e.g. oscilloscopes and other measuring, monitoring, diagnostic, and signal processing instruments). An electrical test probe generally includes a cable (or other transmission path) having a probing head at one end and a testing instrument connector at the other end. The probing head (via at least one probing tip) is for interacting with electrical components. The testing instrument connector is for attaching the cable to testing instruments.

The probing head generally is interconnectable with at least one probing tip, which may be an integral probing tip, a removable probing tip, and/or a replaceable probing tip. A socket, spring contact, or other connection means may be used for connecting a removable and/or replaceable probing tip to the probing head. Many probing heads have mechanisms for connecting two probing tips (one of which may be for probing ground). Probing heads may have mechanisms for connecting to more than two probing tips.

Probing tips may be used, for example, for making electrical contact with signal testing points (e.g. components through which an electrical signal is flowing, such as legs of an IC (integrated circuit), pins, leads, paths, or other electrical components) such as those found on a circuit board. Signals may flow from the testing points through a transmission or input path (that extends substantially the length of the probing tip), through the probing head, through the cable, and to the testing instrument.

Probing tips may connect the probing head to signal testing points (also called probing points). Probing tips may also be used to connect the probing head to ground (a special type of probing point). Ground provides the electrical reference point for other signal measurements. In other words, the ground connection typically remains unchanged while the probing head is positioned at (or otherwise interacts with) other signal testing points, so that the electrical signal thereon may be measured, monitored, or otherwise processed. A user may use multiple probing tips for connecting to multiple signal testing points. For example, a user might want to connect to multiple signal testing points to compare signals thereon or to perform operations on signals thereon (e.g. summing operations, differential operations, or quantifying operations). Alternatively, a user may use one probing tip to connect to ground and another probing tip to connect to a signal testing point having an electrical signal thereon.

It is difficult to form a contact with modern miniaturized testing points. For example, both the pins and the spacing between the pins on a modern integrated circuit chip ("IC") have been miniaturized. When probing for electrical signals in tight spaces, engineers may need to connect two signal testing points simultaneously. This need may arise, for example, as a need to simultaneously connect to a signal testing point and a ground testing point. This need may also arise as a need to connect two signal lines (testing points) in a differential probing setting in an integrated circuit. Tight spaces other than those associated with an integrated circuit might also need to be probed. If two adjacent pins are contacted simultaneously by the probing tip, a short circuit may result between the two adjacent pins. A short circuit may prevent measurement of the desired signal and/or may result in damage to the internal circuitry of the integrated circuit.

In the integrated circuit context, both the signal probing tip and the ground probing tip need to be connected through the legs of the integrated circuit. The distances between the ground testing point and leg testing point to be probed, however, may be variable distances apart, and indeed may change as the desired leg to be probed changes. Thus, a user probing such an integrated circuit needs a flexible multi-spacing method that isolates one leg of such an integrated circuit. This one leg may be a ground or a signal leg. Importantly, when making contact with the legs of the integrated circuit, the probing tips must be electrically isolated from any other integrated circuit legs. If inadvertent electrical contact is made with another leg, a short circuit may result, or an improper reading is possible.

Many solutions to the variable distance problem require a plurality of adapters, each adapter designed for a different distance between integrated circuit legs being probed. This multiple adapter type of solution requires the user to carry extra adapters that can be easily lost. This type of solution also requires the user to remove and replace the adapters which is time consuming and troublesome. This multiple adapter type of solution can also mean that the user does not have the proper adapter. In short, this multiple adapter type of solution is fraught with problems.

BRIEF SUMMARY OF THE INVENTION

The present invention is a probing tip apparatus (also referred to as a probing blade) that is suitable for performing desired probing activities. For example, the probing blade of the present invention can be used to provide a stable ground for high frequency probing and integrated circuit leg probing. The probing blade can be used to connect with many different integrated circuit leg pitches and to span one to more than twenty integrated circuit legs.

A conductive connector of the present invention includes a flexible-deflectable extension having a probing end and a head connection end. A conductive transmission path extends between the probing end and the head connection end. A pogo-rotational-action pin is electrically connected to the transmission path at the head connection end of the flexible-deflectable extension. Preferably, the flexible-deflectable extension is flexibly-deflectably adjustable. Preferably, the pogo-rotational-action pin provides both longitudinal motion (LM) and rotational movement (RM) between the flexible-deflectable extension and a probing head.

In one preferred embodiment, the flexible-deflectable extension has a front surface (through which at least a portion of the transmission path is exposed and/or accessible) and a back surface that is electrically insulated.

In one preferred embodiment, the flexible-deflectable extension further includes a support layer and a covering layer. The transmission path is positioned between the support layer and the covering layer.

In one preferred embodiment, solder is associated with the transmission path at the probing end of the flexible-deflectable extension.

In one preferred embodiment, the pogo-rotational-action pin is interconnectable with a connection mechanism of a probing head of an electrical test probe.

The foregoing and other objectives, features, and advantages of the invention will be more readily understood upon consideration of the following detailed description of the invention, taken in conjunction with the accompanying drawings.

DETAILED DESCRIPTION OF THE INVENTION

Figure 1:
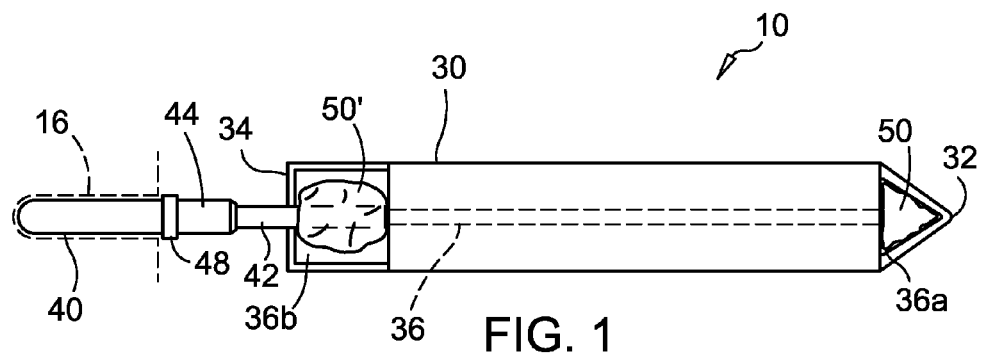
FIG. 1 is a front plan view of a first exemplary embodiment of a probing blade of the present invention having solder on its probing end.

The present invention is directed to a probing tip or conductive connector that is referred to generally as probing blade 10, exemplary embodiments of which are shown in detail in FIGS. 1-10. The probing blade 10 is particularly useful for use in one-handed probing of signal testing points 20 (also discussed as integrated circuit legs 20, legs L, or legs L1-Ln associated with at least one edge of an integrated circuit 22 having, for example, four edges).

As shown in FIGS. 11-15, when the probing blade 10 of the present invention is used in conjunction with a probing head 12 having at least one other probing tip 14 (which may be a probing blade 10), a user can make electrical contact with selective signal testing points 20 "regardless" of the distance therebetween (the maximum distance being limited only by the length of the probing blade 10). Further, a probing head 12 using the probing blade 10 of the present invention can be used between integrated circuit legs 20 "regardless" of any differences in pitch, size, quantity, or spacing of the integrated circuit legs 20 (the maximum distance being limited only by the length of the probing blade 10). This is accomplished without having to install an adapter. In preferred embodiments of the present invention, the probing blade 10 does not add distance to the input path, and provides a very short ground path when used in conjunction with an electrical test probe.

A probing head 12, used in conjunction with a probing blade 10 and a probing tip 14, can be used between a first integrated circuit leg L that contains a signal of interest and a second integrated circuit leg L that contains a signal of interest. Then, without disconnecting the probing blade 10 from the first integrated circuit leg L, the probing head 12 may be rotated so that the probing tip 14 is rotated to a third integrated circuit leg L that contains a signal of interest. This is possible even if the third integrated circuit leg L is on the opposite side of the edge of the integrated circuit 22 from the second integrated circuit leg L. Depending on the length of the probing blade 10, the characteristics of the integrated circuit (e.g. pitch, size, quantity, and/or spacing), and the location of the circuit legs, the second and third circuit legs may be on the same edge, parallel (opposite) edges, or perpendicular (adjacent) edges.

The probing blade 10 may be used with an electrical test probe (FIG. 11) for providing an electrical connection between testing points 20 (one of which may be ground) and a testing instrument. An electrical test probe generally consists of a probing head 12 (that may include at least one socket 16 or other means for attaching to the probing blade 10), a cable 18 (FIG. 11), and a testing instrument connector. At least one integral, removable, and/or replaceable probing blade 10 may be used in connection with the probing head 12. A removable and/or replaceable probing blade 10 would be connected to the probing head 12 using a socket 16, leaf spring, or other connection mechanism. The probing head 12 preferably includes active circuits, or alternatively, may be a passive probing head 12.

One preferred embodiment of the probing blade 10 of the present invention includes a flexible-deflectable extension 30 and a pogo-rotational-action pin 40. The flexible-deflectable extension 30 is flexibly-deflectably adjustable to provide a selective distance between two probing tips (the tips of the probing blade 10 and the probing tip 14) to span, for example, a plurality of integrated circuit legs L or other distances. Preferably, the pogo-rotational-action pin 40 is interconnectable (matable or integral) with a probing head 12 and provides both longitudinal motion (LM) and rotational movement (RM) between the flexible-deflectable extension 30 and the probing head 12.

Flexible-Deflectable Extension

The flexible-deflectable extension 30 is flexibly-deflectably adjustable to provide a selective distance between two probing tips (the tips of the probing blade 10 and the probing tip 14) to span many integrated circuit legs L, or other distances. This flexible-deflectable adjustability is accomplished because the flexible-deflectable extension 30 is able to change shapes with a small amount of force and substantially holds or maintains the shape as long as the force is applied consistently. In preferred embodiments, the shape is incidental in that the shape is a result of the force applied to move the probing head 12 and not as a goal itself. Further, the flexible-deflectable extension 30 substantially returns to its original shape, rather than holding the new shape when the force is removed (i.e. it is not shape retainable). For purposes of this invention, the flexible-deflectable extension 30 is not "floppy" in that it is able to temporarily hold its shape while force is being applied. For purposes of this invention, the flexible-deflectable extension 30 is not stiff in that it is able to change shape easily. Preferably, the flexible-deflectable extension 30 is hand flexible-deflectable such that no special tools are required for flexing-deflecting it. (The amount of force necessary for flexing-deflecting the flexible-deflectable extension 30 would be appropriate for its intended use of one-handed operation of a probing tip for probing electronic probing points.) The flexible-deflectable extension 30 may be loosely characterized as a cantilever-spring.

A flexible-deflectable extension 30 of the present invention preferably includes a probing end 32 suitable for probing and a head connection end 34 that connects (shown as an indirect connection through the pogo-rotational-action pin 40) to a probing head 12. A transmission path 36 extends between the probing end 32 and the head connection end 34. The probing end 32 may be, for example, shaped so that it can be selectively pinned, secured, or otherwise tightly fit between integrated circuit legs L to make selective electrical contact with a desired one of a plurality of integrated circuit legs L. In some preferred embodiments (FIGS. 1, 4-6, and 10), solder 50 is positioned on the probing end 32 of the flexible-deflectable extension 30. The head connection end 34 preferably has an attached pogo-rotational-action pin 40 that may be attached by solder 50'.

Figure 10:
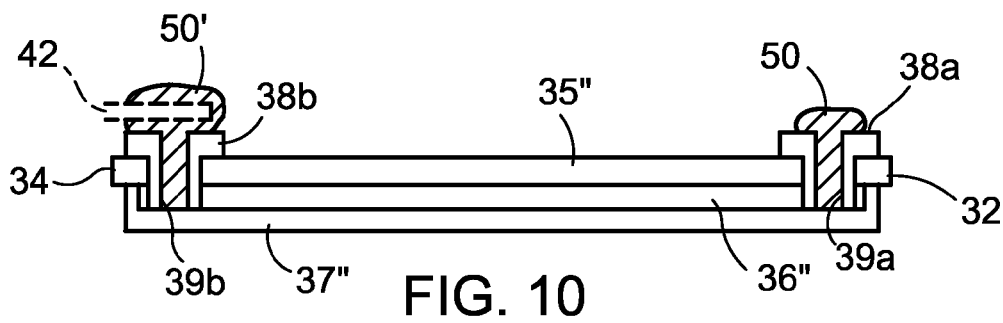
FIG. 10 is a cross-sectional side view of another alternative flexible-deflectable extension of FIG. 7 having solder on its probing end.

Significantly, only one surface (shown as a front surface) or face of the flexible-deflectable extension 30 allows for electrical access to the conductive transmission path 36. Preferably, the second, back (e.g. FIGS. 3 and 9), and/or other surface(s) are electrically insulated or covered such that the conductive transmission path 36 is not exposed. Electrical access may be accomplished, for example, by exposing at least part of the transmission path 36 as "pads" at either end. Electrical access may also be accomplished using alternative means such as through-holes. FIGS. 1-2 and 4-6 show one type of means for accessing the conductive transmission path 36 in which at least a portion of the conductive transmission path 36 is exposed on the surface. In this example, the front surface preferably has an exposed portion of the conductive transmission path 36 (e.g. "pad" 36*a*) at the probing end 32 and, in preferred embodiments, an exposed portion of the conductive transmission path 36 (e.g. "pad" 36*b*) at the head connection end 34. FIGS. 7 and 10 show another type of means for accessing the conductive transmission path 36 using through-holes 39*a*, 39*b* in "pads" 38*a*, 38*b*. The through-holes 39*a*, 39*b* preferably have an interior surface that is conducting or transmission enhancing. It should be noted that other types of electrical paths may allow electrical access from the front surface to the conductive transmission path 36.

Figure 2:
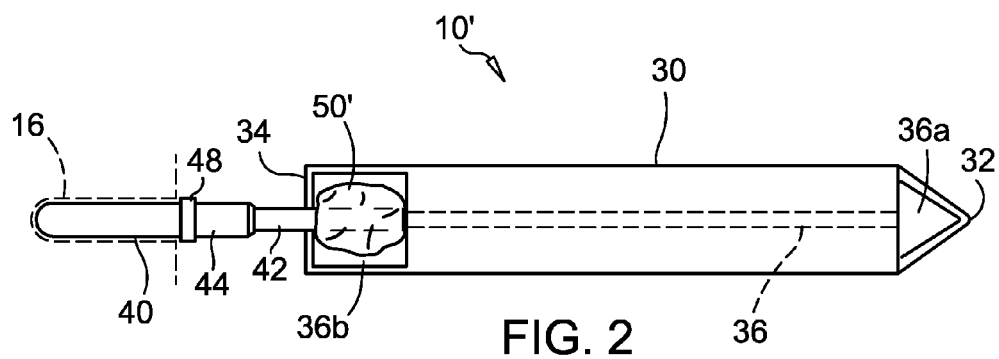
FIG. 2 is a front plan view of a second exemplary embodiment of a probing blade of the present invention without solder on its probing end.
Figure 3:
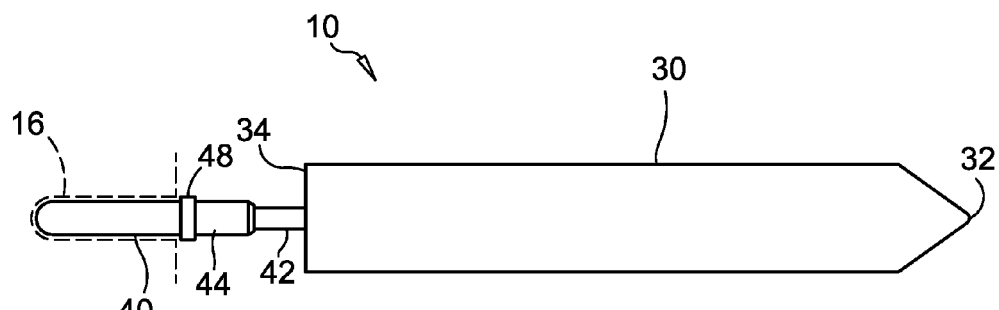
FIG. 3 is a back plan view of an exemplary embodiment of a probing blade of the present invention.

FIG. 1 shows the front surface of a first exemplary embodiment of a probing blade 10 of the present invention having solder 50 on its probing end 32. FIG. 2 shows the front surface of a second exemplary embodiment of a probing blade 10' of the present invention. The primary difference between the first embodiment probing blade 10 and the second embodiment probing blade 10' is that the first embodiment probing blade 10 has solder 50 on its probing end 32, whereas the second embodiment probing blade 10' does not. In both embodiments 10, 10' a transmission path 36 extends between the probing end 32 and the head connection end 34. It should be noted that the shown transmission path is meant to be exemplary and may have different characteristics (e.g. it may be wider or narrower than the path shown). FIG. 3 shows an exemplary back surface of either the first exemplary embodiment or the second exemplary embodiment.

Figure 4:
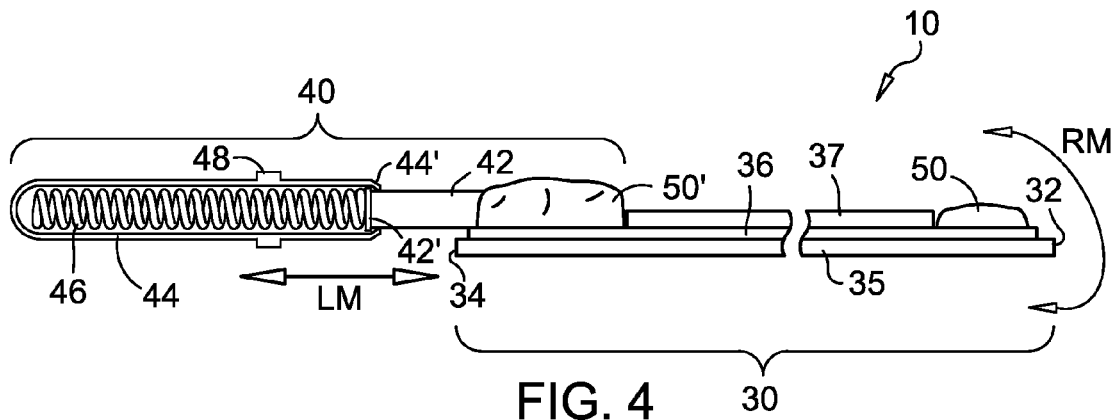
FIG. 4 is a partial side view of the first exemplary embodiment of a probing blade of the present invention, the pogo-rotational-action pin (shown in cross-section) being in an expanded state.
Figure 5:
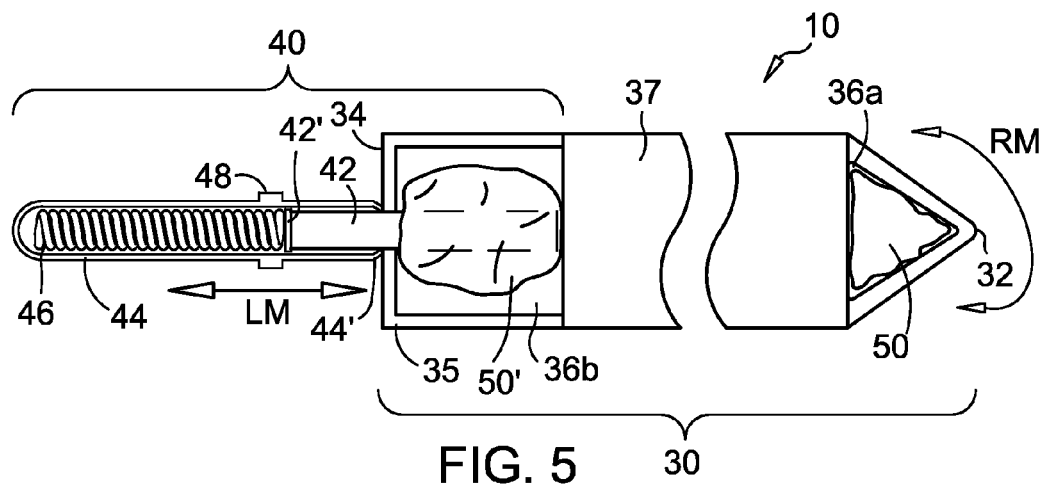
FIG. 5 is a partial front view of the first exemplary embodiment of a probing blade of the present invention, the pogo-rotational-action pin (shown in cross-section) being in a contracted state, and the flexible-deflectable extension being rotated 90° from the position of the flexible-deflectable extension shown in FIG. 4.

FIG. 4 shows an exemplary embodiment of the probing blade 10, 10' from the side. In this embodiment, the electrical or transmission path 36 (e.g. a conductive layer) is positioned between a support layer 35 (e.g. flex) and a covering layer 37 (e.g. a protective insulating layer). The layers (e.g. the transmission path 36, the support layer 35, and the covering layer 37) are preferably constructed as a flexible printed circuit board. The substantial "sandwiching" of the transmission path 36 between the non-conductive support layer 35 and the non-conductive covering layer 37 helps to prevent unwanted electrical contact with the transmission path 36. As shown in FIG. 5, the transmission path 36 may have an enlarged "pad" 36*a* at the probing end 32 and an enlarged "pad" 36*b* at the head connection end 34. The enlarged "pads" 36*a*, 36*b* facilitate better and/or easier connections. One example of this is that the inner member 42 of the pogo-rotational-action pin 40 can easily be soldered or electrically connected to the enlarged "pad" 36*b* at the head connection end 34. Another example of this is that the enlarged "pad" 36*a* at the probing end 32 makes it easy to connect to signal testing points 20.

Figure 7:
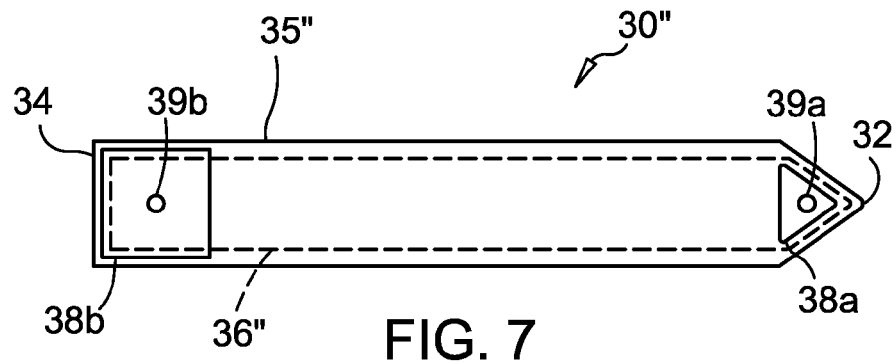
FIG. 7 is a front plan view of an alternative flexible-deflectable extension that could be used in a third exemplary embodiment of a probing blade of the present invention.
Figure 8:
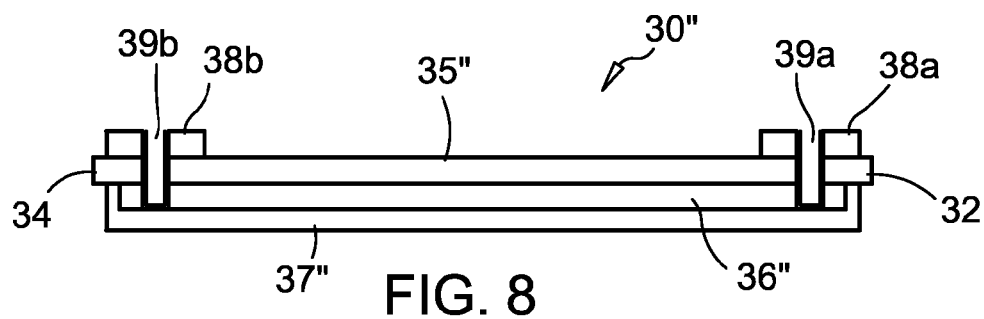
FIG. 8 is a cross-sectional side view of the alternative flexible-deflectable extension of FIG. 7.
Figure 9:
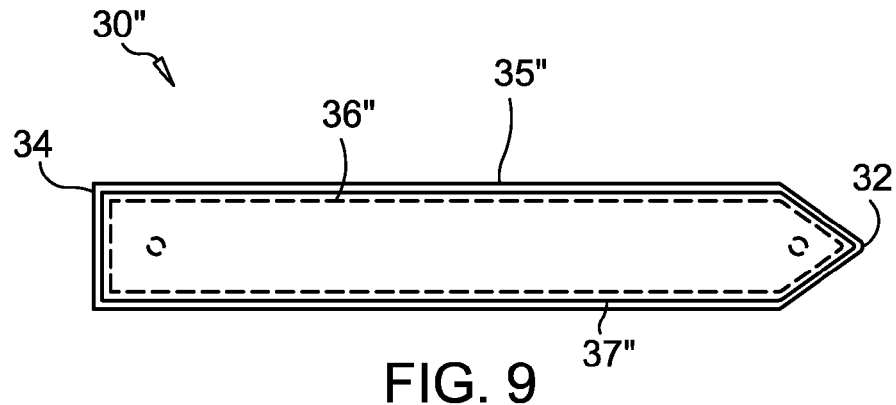
FIG. 9 is a back plan view of the alternative flexible-deflectable extension of FIG. 7.

FIGS. 7-10 show an alternative exemplary embodiment of a flexible-deflectable extension 30" the probing blade. In this alternative embodiment, although the electrical or transmission path 36" (e.g. a conductive layer) is positioned between a support layer 35" (e.g. flex) and a covering layer 37" (e.g. a protective insulating layer), the positioning of these layers is different than the positioning of the layers shown in FIG. 4. Specifically, the support layer 35" is on the top and the covering layer 37" is on the bottom. The substantial "sandwiching" of the transmission path 36" between the non-conductive support layer 35" and the non-conductive covering layer 37" helps to prevent unwanted electrical contact with the transmission path 36". The layers (e.g. the transmission path 36", the support layer 35", and the covering layer 37") are preferably constructed as a flexible printed circuit board. In this embodiment, an enlarged "pad" 38*a* (at the probing end 32) and an enlarged "pad" 38*b* (at the head connection end 34) are added to the top surface of the support layer 35". The enlarged "pads" 38*a*, 38*b* have at least one through-hole 39*a*, 39*b* (or void) defined therein that extends through the support layer 35" and (optionally) through the transmission path 36". Alternatively, the through-hole 39*a*, 39*b* could abut transmission path 36" or extend through only a part of the transmission path 36". The through-holes 39*a*, 39*b* preferably have a conducting or transmission enhancing layer or coating (e.g. metals such as copper or gold) on the interior surface thereof. The enlarged "pads" 38*a*, 38*b* and conducting through-holes 39*a*, 39*b* allow signal transmission from the top surface of the probing end 32, through the transmission path 36", and to the head connection end 34. It should be noted that the enlarged "pads" 38*a*, 38*b* and conducting through-holes 39*a*, 39*b* may be formed by rivet-like devices, layers, coatings, and/or a combination thereof. For example, FIG. 8 shows the enlarged "pads" 38a, 38b as a layer and the through-holes 39a, 39b having a coating (shown as a thicker line) thereon that covers inner peripheral surfaces of the layers 38a, 38b, and 36. FIG. 10 shows the enlarged "pads" 38a, 38b and the through-holes 39a, 39b being created using a rivet-like device or a unified layer/coating (e.g. one layer or coating that is both on the top surface of the flexible-deflectable extension 30" and in the through-holes 39a, 39b). FIG. 10 also shows solder 50, 50' in the through-holes 39a, 39b.

As mentioned, the substantial "sandwiching" of the transmission path 36 between the non-conductive support layer 35 and the non-conductive covering layer 37 helps to prevent unwanted electrical contact with the transmission path 36. The "pads" and solder at the probing end 32 are only on one side/face of the probing blade 10. Because only one face of the probing end 32 is conductive, only one probing point 20 will be probed when the probing end 32 is positioned, for example, between two legs L. However, the user may rotate the flexible-deflectable extension 30 on the pogo-rotational-action pin 40 by 180° to probe either adjacent leg. In the preferred embodiment, the pogo-rotational-action pin 40 allows rotation in either direction in a 360° circle.

In preferred embodiments, the electrical or transmission path may be made of any conductive and flexible material. Exemplary preferred transmission path materials include copper or gold. In preferred embodiments, the support layer may be made of any "sturdy," non-conductive, and flexible material. Exemplary preferred support layer materials include kapton, polyimide, Rogers R-Flex® (Rogers Corporation, Advanced Circuit Materials Division, Chandler, Ariz.), or Pyralux® (DuPont, Wilmington, Del.). In preferred embodiments, the covering layer may be made of any insulating, non-conductive and flexible material. Exemplary preferred covering layer materials include insulative kapton.

It should be noted that the proportions shown in the drawings are not drawn to scale. For example, the through-holes 39a, 39b may be significantly smaller in proportion to that shown in FIGS. 7-10. The "pads" of the various embodiments may be enlarged or of a smaller size. Another example is that the thickness of the layers in FIGS. 4, 8, and 10 may be significantly thicker than the shown preferred embodiments of the present invention. The thicknesses of the layers shown in the drawing have been exaggerated for purposes of drawing clarity. An exemplary preferred embodiment of the present invention would have a flexible-deflectable extension that is ⅜ inches-⅝ inches in length. This exemplary flexible-deflectable extension would be between 0.004 inches and 0.015 inches in thickness including the transmission path, the support layer, and the covering layer. These dimensions are meant to be exemplary and are not meant to limit the scope of the invention.

In the shown embodiments, the probing end 32 is a flat triangular-shaped tip. The flat triangular-shaped tip is able to hold a stable contact for integrated circuit legs L. As shown, the flat triangular-shaped tip has at least two equal sides (isosceles), but the sides could be uneven. Also, although the flat triangular-shaped tip is shown as having an angle of approximately 40°-70°, larger and smaller angles could be used. The probing end 32 may have a more conventional sharp-tip shape and not a specialty flat triangular-shaped tip. Other alternative shapes could be constructed such as the tips described in U.S. Pat. No. 6,538,424 (Notched Electrical Test Probe Tip), U.S. Pat. No. 6,809,535 (Notched Electrical Test Probe Tip), U.S. Pat. No. 7,140,105 (Notched Electrical Test Probe Tip), U.S. Pat. No. 6,650,131 (Electrical Test Probe Wedge Tip), U.S. Pat. No. 6,518,780 (Electrical Test Probe Wedge Tip), U.S. Pat. No. D444,720 (Notched Electrical Test Probe Tip), and U.S. Pat. No. D444,401 (Electrical Test Probe Wedge Tip). These patents/applications are assigned to the assignee of the present invention and their specifications are incorporated herein by reference. Still other preferred embodiments could be a hybrid. For example, one or more sides of the flat triangular-shaped tip may have a notch defined therein. Another example of a hybrid is that the flat triangular-shaped tip may be relatively thick so that it can be tapered in one or more planes.

For higher bandwidth fidelity of the electrical test probe, the overall length of the flexible probing blade 10 could be shortened, or alternatively a compensating circuit could be added in series with ground (signal) path (transmission path 36). The thickness of the flexible-deflectable extension 30 could be increased. It should also be noted that any desired electrical test probe holder, including a human hand, will work with the probing blade 10 of the present invention.

Pogo-Rotational-Action Pin

The pogo-rotational-action pin 40 (also referred to herein as a "pogo pin 40") of the present invention is a spring-loaded pin that allows for two types of motion: longitudinal (LM) and rotational (RM). This may be accomplished using the structure shown in FIGS. 4 and 5 that includes an inner member 42 (shown as a shaft, plunger, or pin) that is slideable and rotatable within an outer member 44 (shown as a sleeve). A spring 46 provides an outward force tending to push the inner member 42 outward so that the pogo-rotational-action pin 40 is in an extended position as shown in FIG. 4. FIG. 5 shows the pogo-rotational-action pin 40 in a retracted position. The pogo-rotational-action pin 40 is attached to the transmission path 36 at one end (e.g. at the enlarged "pad" 36b at the head connection end 34 of the flexible-deflectable extension 30 via solder 50') and to a socket 16 of a probing head 12 at a second end (see FIGS. 1-3). In such a position, it is part of the electrical path that facilitates the transmission of signals between testing points 20 and a testing instrument.

As shown in FIGS. 4 and 5, the pogo-rotational-action pin 40 includes an inner member 42 that is slideable and rotatable within an outer member 44. In one preferred embodiment, the inner member 42 includes a conductive base or contactor 42' that extends at least partially beyond the annular edge of the end of the inner member 42. Preferably the contactor 42' is disk shaped and has a diameter slightly larger than the diameter of the inner member 42. In one preferred embodiment, the outer member 44 includes an inward lip 44' that bends at least partially inward towards the longitudinal center axis of the outer member 44. Preferably the inward lip 44' bends inwards annularly along the open end of the outer member 44 that receives the inner member 42. A spring 46 is positioned within the outer member 44. One end of the spring 46 butts against (so that it cannot go further, but is not necessarily secured to the outer member) the outer member 44 and the other end of the spring 46 butts against the end of the inner member 42 (contactor 42') positioned within the outer member 44. The spring 46 provides an outward force tending to push the inner member 42 outward so that the pogo-rotational-action pin 40 is in an extended position as shown in FIG. 4. In the shown embodiment, the extension position is limited by the contactor 42' coming into contact with the inward lip 44'. FIG. 5 shows the pogo-rotational-action pin 40 in a retracted position. The retracted position occurs when the outward force of the spring 46 is overcome by external force (e.g. the pogo pin 40 is being pushed inward) and the inner member 42 slides into the outer member 44 and the spring 46 compacts or compresses. It should be noted that the pogo-rotational-action pin 40 should be conductive to allow signals to flow therethrough.

Figure 12:
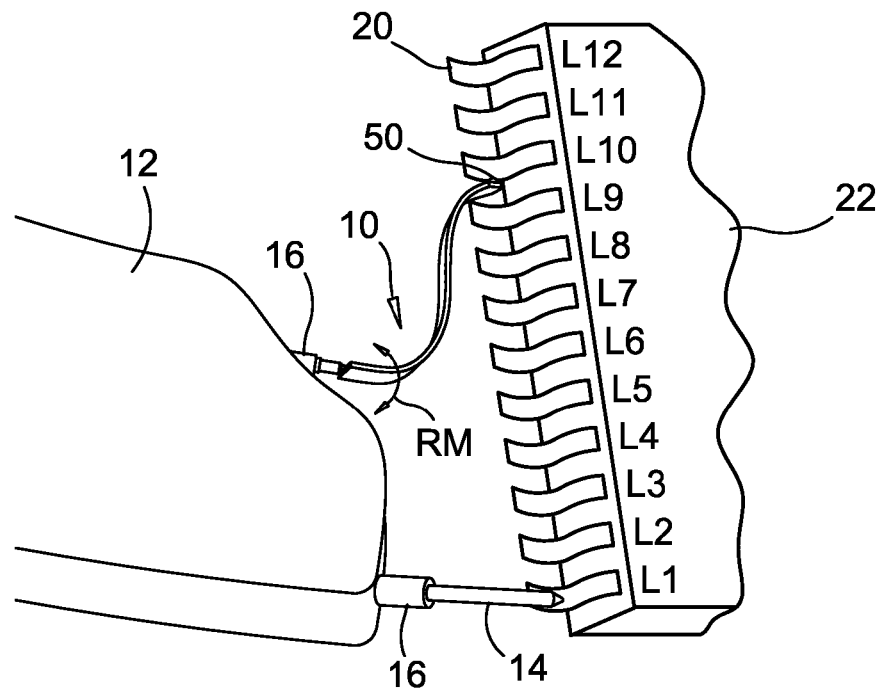
FIG. 12 is a perspective view of a probing blade of the present invention being used in a probing head to probe two signal testing points that are far apart (a far distance apart).
Figure 13:
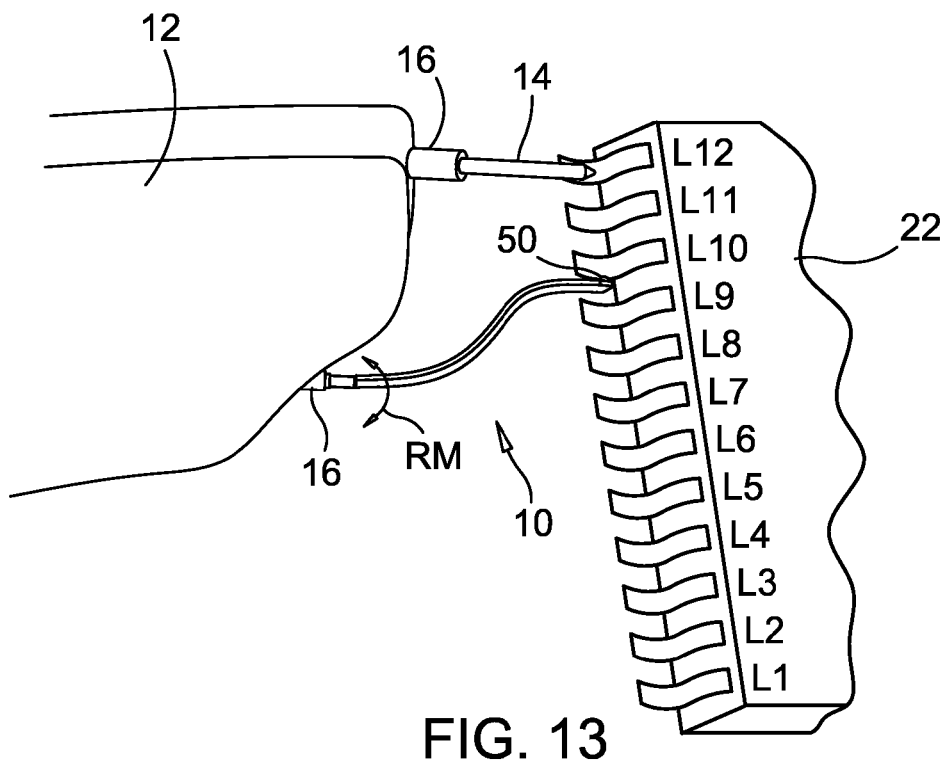
FIG. 13 is a perspective view of a probing blade of the present invention being used in a probing head to probe two signal testing points that are close together (a close distance apart).
Figure 14:
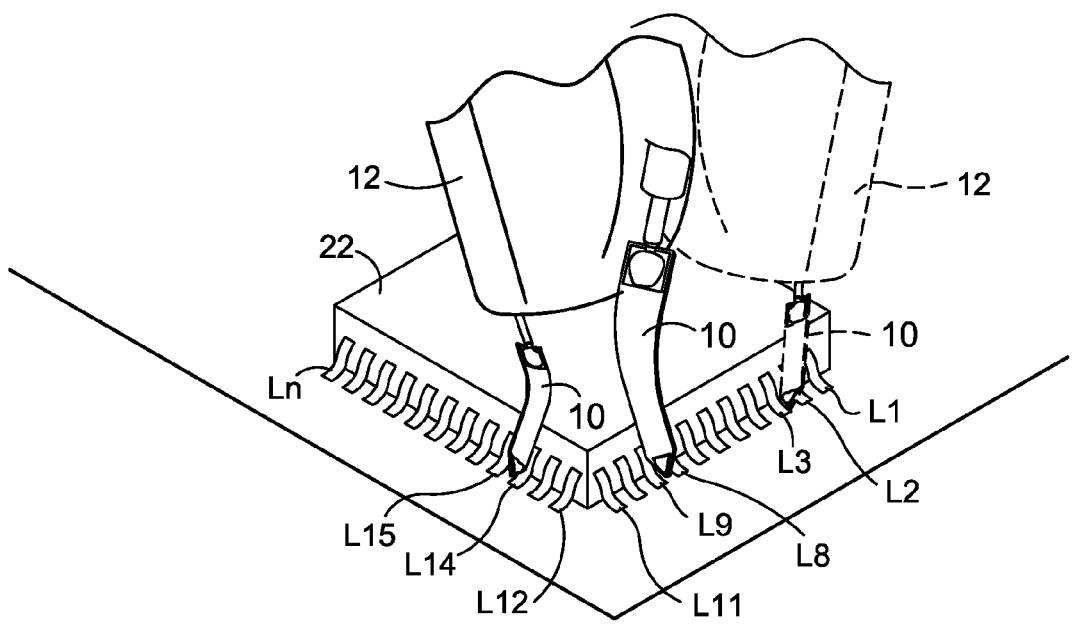
FIG. 14 is a perspective view of two probing blades of the present invention shown being used in a single probing head, the position of the probing head after rotational movement being shown in phantom.

The pogo-rotational-action pin 40 allows for two types of motion: longitudinal and rotational. The longitudinal motion (shown as dual directional arrow LM) is the traditional in/out motion of spring loaded pogo pins. The longitudinal motion is important because it provides a mechanism for variable force that translates to the probing end 32 that, in turn, interacts with the testing point with variable force. The rotational motion (shown as dual directional arrow RM) is important because it provides rotational positioning of the probing end 32. It is the rotational motion that allows a probing head 12 using the probing blade 10 to probe a first integrated circuit leg L and, without disconnecting, rotate between a second integrated circuit leg L on one side of the integrated circuit 22 and a third integrated circuit leg L on the opposite side of the first integrated circuit leg L. The two positions are shown in FIGS. 12 and 13. FIG. 14 shows the two positions on the same figure, one being in phantom.

Figure 6:
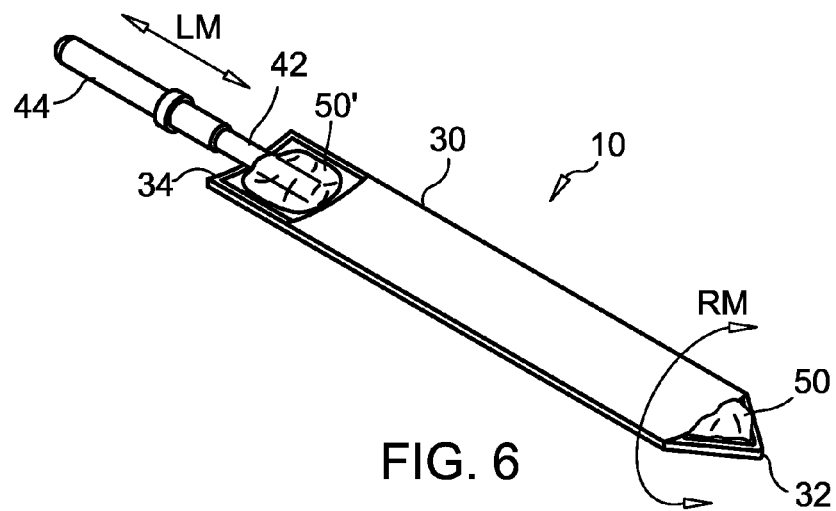
FIG. 6 is a perspective view of the exemplary embodiment shown in FIG. 1 showing rotational and linear movement.

FIGS. 4-6 show the longitudinal and rotational movement of a preferred exemplary embodiment of the pogo-rotational-action pin 40 in detail. FIG. 4 shows the pogo-rotational-action pin 40 in an expanded state and FIG. 5 shows the pogo-rotational-action pin 40 in a contracted state. The expanding and contracting of the pogo-rotational-action pin 40 is the longitudinal motion. FIG. 4 shows the flexible-deflectable extension 30 in first position and FIG. 5 shows the flexible-deflectable extension 30 in a second position, the second position being 90° from the first position. The pogo-rotational-action pin 40 allows for the rotational motion between the first position and the second position (or any other position in a 360° circle with the longitudinal axis of the pogo-rotational-action pin 40 being the center of the circle). It should be noted that the pogo-rotational-action pin 40 preferably can rotate 360° in its expanded state, its contracted state, and any state therebetween.

The pogo-rotational-action pin 40 may be integral or removable and/or replaceable. If the probing blade probing tip 10 is replaceable, generally the probing head 12 will have a socket 16 or other connection mechanism for mating with the probing blade 10. A shoulder/stop 48 may be provided on the annular exterior surface of the outer member 44 to provide an indication of a proper insertion depth of the pogo-rotational-action pin 40 within the socket 16. The shoulder/stop 48 may also be used as a grip for fingers, tweezers, and/or other tools.

Solder

Figure 15:
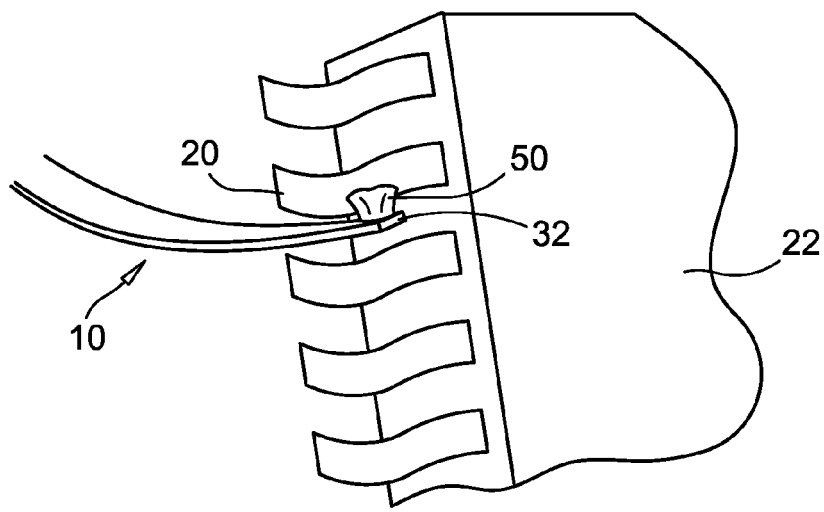
FIG. 15 is a perspective view of a probing end of a flexible-deflectable extension wedged between two integrated circuit legs, the solder being fused to the integrated circuit leg that is being probed.

Preferred exemplary embodiments of a probing blade 10 of the present invention may have solder 50 (shown as a solder bump) on its probing end 32. The solder 50 serves several purposes. First, the metal contact of the solder 50 may be pushed against an integrated circuit leg L or other testing point 20 having a signal of interest thereon. Second, the solder 50 may help prevent or reduce curling (e.g. the longitudinal edges of the flexible-deflectable extension 30 curling upwards and inwards) of the flexible-deflectable extension 30. FIG. 6 shows a slight curling that may be present even with the use of solder 50. Third, the solder 50 may act as a foot or other type of catch to help keep the probing end 32 properly wedged between two circuit legs L. Fourth, as shown in FIG. 15, it may be flowed (melted) to attach the probing end 32 to a circuit leg L to be probed.

It should be noted that the term "solder" is used in its general sense. Alternative electrical connection means including welding or silver epoxy may be used in place of the solder.

EXAMPLES

Figure 11:
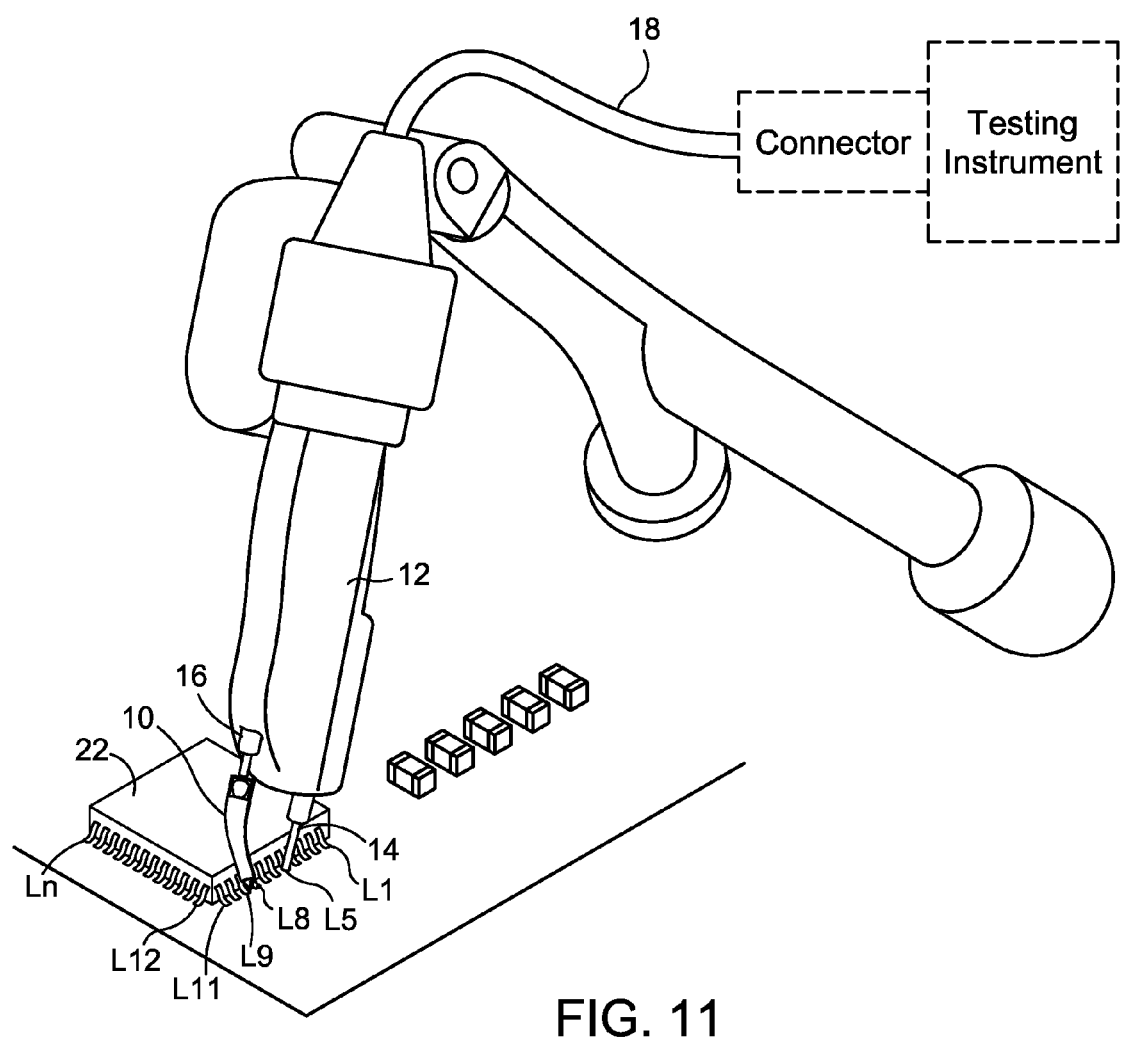
FIG. 11 is a perspective view of a probing blade of the present invention showing being used in a probing head supported by legs, the two signal testing points being a medium distance apart.

FIG. 11 shows a probing blade 10 of the present invention being used with a probing head 12 supported by legs for forming a tripod, the two signal testing points 20 being a medium distance apart. The legs may be those described in U.S. Pat. No. 6,462,529 (Legs For Forming A Tripod With An Electrical Test Probe), which is assigned to the assignee of the present invention and its specification is incorporated herein by reference. In this figure, the probing head 12 has both a probing blade 10 and a standard probing tip 14. The probing end 32 of the probing blade 10 is positioned between L8 and L9 and the second probing tip 14 is positioned on L5. Because only one face of the probing end 32 is conductive, only one probing point (L9) will be probed. The probing end 32 may include solder 50 that can be used to secure (for example, as a foot or soldered) the probing end 32 for probing. In this position, the pogo-rotational-action pin 40 has force being exerted on it so that the spring 46 is compressed and the pogo-rotational-action pin 40 is in a retracted position.

FIGS. 12 and 13 show a probing blade 10 of the present invention being used with a probing head 12 to probe two signal testing points 20 that are far apart (widely separated or a far distance apart) (FIG. 12) and two signal testing points 20 that are close together (a close distance apart) (FIG. 13). This shows the rotational motion (RM) feature of the present invention. In this embodiment, the probing end 32 of the probing blade 10 is positioned between L9 and L10. Because only one face of the probing end 32 is conductive, only one probing point (L10) will be probed. The probing end 32 may be soldered in place, hooked in place (using the solder as a foot), or held in place by friction (e.g. if the distance between legs is close). It is the rotational motion that allows a probing head 12 to use the second probing tip 14 to probe a first integrated circuit leg L1 (FIG. 12) and, without disconnecting, rotate so that the second probing tip 14 probes a second integrated circuit leg L12 (FIG. 13). In this example, L1 is on one side of the probing blade 10 (positioned between L9 and L10) and L12 is on the opposite side of the probing blade 10 (positioned between L9 and L10).

FIG. 14 shows a probing head 12 with two probing blades 10. This figure also shows two positions of the probing head 12 (one in phantom), again showing the rotational motion (RM) feature of the present invention. In this example, the probing head 12 is being used to probe two signal testing points 20 that are on opposite edges of an integrated circuit. As shown, the probing end 32 of the first probing blade 10 is positioned between L8 and L9. Because only one face of the probing end 32 is conductive, only one probing point (L9) will be probed. This probing end 32 may be soldered in place, hooked in place (using the solder as a foot), or held in place by friction (e.g. if the distance between legs is relatively small). In this figure, the second probing blade 10 probes a first integrated circuit leg L14 (solid) and, without disconnecting, rotates so that the second probing blade 10 probes a second integrated circuit leg L3 (in phantom). In this example, L14 is on one edge of the integrated circuit and L3 is on a different edge of the integrated circuit.

Method of Use

The present invention also includes a method for using the probing blade 10 of the present invention. In preferred embodiments of the method, the probing blade 10 is used in conjunction with a probing head 12 having at least one other probing tip 14 (that may be a probing blade 10). The probing head 12 can be used to make electrical contact with, for example, two signal testing points 20.

The first step of the method is to provide a probing blade 10 that has a flexible-deflectable extension 30 and a pogo-rotational-action pin 40. The flexible-deflectable extension 30 includes a probing end 32 (suitable for probing) and a head connection end 34 (suitable for connecting to a probing head 12—shown as an indirect connection through the pogo-rotational-action pin 40). FIGS. 1-10 show exemplary probing blades 10 in a substantially straight shape.

Next, as shown in FIGS. 11-15, a user positions the probing end 32 of a flexible-deflectable extension 30 between two integrated circuit legs L or other probing points 20. Alternatively, the probing end 32 may be positioned on top of, behind, against, hooked to, or otherwise in electrical contact with at least one probing point 20. If there is solder 50 on the probing end 32, it may then be flowed, melted, or otherwise electrically attached to the probing point 20 (as shown in FIG. 15).

The next step is to apply force to or otherwise create motion of the probing blade 10. The force may be rotational so as to create rotational motion (RM) so that a probing head 12 swivels in relation to the flexible-deflectable extension 30 using the pogo-rotational-action pin 40 as the pivot. The force may be longitudinal so as to create longitudinal motion (LM) so that the probing head 12 is pushed towards the probing point 20. A small amount of longitudinal force causes the pogo-rotational-action pin 40 to contract longitudinally (longitudinal motion (LM)) to create a better electrical connection. A larger amount of longitudinal force can cause the flexible-deflectable extension 30 to bend or bow. Force in other directions (e.g. diagonally, horizontally, rotationally) is absorbed by the bending of the flexible-deflectable extension 30. The force in other directions allows the probing head 12 to move in relation to the probing point 20. This would be important as the probing head 12 is moved so that the other probing tip 14 is used to probe a second probing point 20. Because the flexible-deflectable extension 30 is flexibly-deflectably adjustable, it is able to change shapes and hold the shape as long as the force remains, but substantially returns to its original shape, rather than holding the new shape when the force is removed.

A probing head 12, used in conjunction with a probing blade 10 and a probing tip 14, can be used between a first integrated circuit leg L that contains a signal of interest and a second integrated circuit leg L that contains a signal of interest. Then, without disconnecting the probing blade 10 from the first integrated circuit leg L, the probing head 12 may be rotated so that the probing tip 14 is rotated to a third integrated circuit leg L that contains a signal of interest. This is possible even if the third integrated circuit leg L is on the opposite side of the edge of the integrated circuit 22 from the second integrated circuit leg L. Depending on the length of the probing blade 10, the characteristics of the integrated circuit (e.g. pitch, size, quantity, and/or spacing), and the location of the circuit legs, the second and third circuit legs may be on the same edge, parallel (opposite) edges, or perpendicular (adjacent) edges.

Miscellaneous

It should be noted that topographies other than that of an integrated circuit 22 layout may be probed by the probing blade of the present invention.

It should be noted that the probing blade of the present invention may be used to provide a stable ground for high frequency probing and integrated circuit leg L probing. It should be noted that the probing blade is specifically not limited to a ground connection.

It should be noted that relational terms used in this specification are for purposes of clarity and are not meant to limit the scope of the invention. For example, the terms "top" and "bottom" or the terms "front" and "back" are meant to be relational and, if the probing blade were held in an alternative position, the terms could be reversed or changed completely to describe the new orientation.

It will thus be seen that the objects set forth above, among those made apparent from the preceding description, are efficiently attained and, since certain changes may be made in the above construction(s) without departing from the spirit and scope of the invention, it is intended that all matter contained in the description and/or shown in the accompanying drawings shall be interpreted as illustrative and not in a limiting sense.

It is also to be understood that the description and drawings are intended to cover all of the generic and specific features of the invention herein described and all statements of the scope of the invention which, as a matter of language, might be said to fall therebetween.

The terms and expressions that have been employed in the foregoing specification are used as terms of description and not of limitation, and are not intended to exclude equivalents of the features shown and described or portions of them. The scope of the invention is defined and limited only by the claims that follow.

What is claimed is:

1. A conductive connector comprising:
    (a) a flexible-deflectable extension having a probing end and a head connection end;
    (b) a conductive transmission path extending between said probing end and said head connection end;
    (c) a pogo-rotational-action pin having a first end and a second end, said first end electrically connected to said transmission path at said head connection end of said flexible-deflectable extension; and
    (d) said pogo-rotational-action pin facilitating both longitudinal motion (LM) and rotational movement (RM) between said flexible-deflectable extension and a probing head.

2. The conductive connector of claim 1, wherein said flexible-deflectable extension is flexibly-deflectably adjustable.

3. The conductive connector of claim 1, said flexible-deflectable extension having a front surface and a back surface, said front surface having at least a portion of said transmission path exposed thereon, said back surface being electrically insulated.

4. The conductive connector of claim 1, said flexible-deflectable extension having a front surface and a back surface, said front surface having an electrical path that allows electrical access to said transmission path, said back surface being electrically insulated.

5. The conductive connector of claim 1, wherein said flexible-deflectable extension has a first shape, said flexible-deflectable extension changing shape to a second shape upon the application of force, said flexible-deflectable extension substantially maintaining said second shape as long as said force is applied consistently, and said flexible-deflectable extension substantially returning to said first shape upon removal of said force.

6. The conductive connector of claim 1, wherein said pogo-rotational-action pin provides both longitudinal motion (LM) and rotational movement (RM) between said flexible-deflectable extension and a probing head.

7. The conductive connector of claim 1, said flexible-deflectable extension further comprising a support layer and a covering layer, said transmission path positioned between said support layer and said covering layer.

8. The conductive connector of claim 1, further comprising solder, said solder associated with said transmission path at said probing end of said flexible-deflectable extension.

9. A conductive connector comprising:
(a) a flexible-deflectable extension having a probing end and a head connection end;
(b) a conductive transmission path extending between said probing end and said head connection end;
(c) a pogo-rotational-action pin having a first end and a second end, said first end electrically connected to said transmission path at said head connection end of said flexible-deflectable extension; and
(d) said second end of said pogo-rotational-action pin interconnectable with a connection mechanism of a probing head of an electrical test probe.

10. The conductive connector of claim 9, further comprising solder, said solder associated with said transmission path at said probing end of said flexible-deflectable extension.

11. The conductive connector of claim 9, wherein said flexible-deflectable extension is flexibly-deflectably adjustable.

12. The conductive connector of claim 9, said flexible-deflectable extension having a front surface and a back surface, said front surface having at least a portion of said transmission path exposed thereon, said back surface being electrically insulated.

13. The conductive connector of claim 9, wherein said flexible-deflectable extension has a first shape, said flexible-deflectable extension changing shape to a second shape upon the application of force, said flexible-deflectable extension substantially maintaining said second shape as long as said force is applied consistently, and said flexible-deflectable extension substantially returning to said first shape upon removal of said force.

14. The conductive connector of claim 9, wherein said pogo-rotational-action pin provides both longitudinal motion (LM) and rotational movement (RM) between said flexible-deflectable extension and a probing head.

15. A conductive connector comprising:
(a) a flexible-deflectable extension having a probing end and a head connection end, said flexible-deflectable extension being flexibly-deflectably adjustable;
(b) a conductive transmission path extending between said probing end and said head connection end; and
(c) a pogo-rotational-action pin having a first end and a second end, said first end electrically connected to said transmission path at said head connection end of said flexible-deflectable extension, said pogo-rotational-action pin providing both longitudinal motion (LM) and rotational movement (RM) between said flexible-deflectable extension and a probing head.

16. The conductive connector of claim 15, said flexible-deflectable extension having a front surface and a back surface, said front surface having at least a portion of said transmission path exposed thereon, said back surface being electrically insulated.

17. The conductive connector of claim 15, said flexible-deflectable extension having a front surface and a back surface, said front surface having an electrical path that allows electrical access to said transmission path, said back surface being electrically insulated.

18. The conductive connector of claim 15, wherein said flexible-deflectable extension has a first shape, said flexible-deflectable extension changing shape to a second shape upon the application of force, said flexible-deflectable extension substantially maintaining said second shape as long as said force is applied consistently, and said flexible-deflectable extension substantially returning to said first shape upon removal of said force.

19. The conductive connector of claim 15, said flexible-deflectable extension further comprising a support layer and a covering layer, said transmission path positioned between said support layer and said covering layer.

20. The conductive connector of claim 15, further comprising solder, said solder associated with said transmission path at said probing end of said flexible-deflectable extension.

21. The conductive connector of claim 15, wherein said second end of said pogo-rotational-action pin is interconnectable with a connection mechanism of a probing head of an electrical test probe.

* * * * *